United States Patent [19]
Feeney et al.

[11] Patent Number: 5,294,895
[45] Date of Patent: Mar. 15, 1994

[54] MICROWAVE OSCILLATORS AND TRANSMITTERS WITH FREQUENCY STABILIZATION

[75] Inventors: Stuart M. Feeney, Campbell, Calif.; David H. Evans; Kenneth Holford, both of Crawley, England

[73] Assignee: U.S. Philips Corporation, New York, N.Y.

[21] Appl. No.: 954,727

[22] Filed: Sep. 30, 1992

[30] Foreign Application Priority Data

Oct. 9, 1991 [GB] United Kingdom ............... 9121415

[51] Int. Cl.$^5$ ............................................. H03B 7/14
[52] U.S. Cl. .................................. 331/9; 331/26; 331/107 DP; 331/96; 331/36 C
[58] Field of Search ............. 331/1 R, 9, 107 DP, 331/107 P, 107 R, 107 G, 107 T, 96, 23, 25, 26, 36 C

[56] References Cited

U.S. PATENT DOCUMENTS

| | | | |
|---|---|---|---|
| 3,510,800 | 5/1970 | Kaneko et al. | 331/107 DP X |
| 3,626,327 | 12/1971 | Luchsinger et al. | 331/107 R |
| 3,705,364 | 12/1972 | Takeshima | 332/18 |
| 3,737,804 | 6/1973 | Sakamoto et al. | 331/107 DP |
| 4,201,956 | 5/1980 | Kienberger et al. | 331/107 DP X |

FOREIGN PATENT DOCUMENTS

| | | |
|---|---|---|
| 0164994 | 6/1985 | European Pat. Off. |
| 2197264 | 3/1974 | France |
| 55-083304 | 6/1980 | Japan |
| 55-83304 | 6/1980 | Japan |
| 1293986 | 10/1970 | United Kingdom |
| 1327118 | 4/1971 | United Kingdom |
| 1432189 | 8/1973 | United Kingdom |

*Primary Examiner*—David Mis
*Attorney, Agent, or Firm*—Robert J. Kraus

[57] ABSTRACT

In addition to a first opening (11) forming a primary output from a waveguide cavity (10) of a microwave oscillator, a coupling aperture (12) in a reflective wall (32) provides a secondary output which does not degrade the performance or tuning characteristics of the source. Less than −20 dB of the source power may be coupled out via the aperture (12) and is used in a feedback loop (12,21,23,24,36) with an harmonic mixer (21) and frequency discriminator (24) to stabilize the source. The mixer comprises a further waveguide section (15) separated from the source cavity (10) by the reflective wall (32). An advantageous mixer assembly comprises a circuit substrate which is mounted across the further waveguide cavity (15) and which carries an inductive probe by which the signal from the coupling aperture (12) is fed to an antiparallel pair of mixer diodes on the substrate. The whole assembly may be bolted together through holes (34).

11 Claims, 3 Drawing Sheets

MICROWAVE OSCILLATORS AND TRANSMITTERS WITH FREQUENCY STABILIZATION

BACKGROUND OF THE INVENTION

This invention relates to microwave oscillators comprising a waveguide source cavity in which there is mounted an oscillator device, particularly but not exclusively a Gunn diode, for generating power of a desired microwave frequency; the invention is concerned with stabilizing the oscillator frequency. Such an oscillator may be designed for use as the transmitting source in microwave transmission equipment (e.g. in a video distribution system) or in radar for example, or it may be designed for use in a non-transmitting mode (e.g. for a local oscillator in instrumentation). The invention also provides a simple microwave transmitter comprising such an oscillator as its microwave source.

For many waveguide sources operating within the frequency range of 26 GHz to 100 GHz, there is a need for low-cost control arrangements to improve the long-term behaviour of the source, particularly its frequency stability and/or its amplitude stability. Thus it is found that over a 2 year period the centre frequency of the source may drift by 10 MHz or more.

It is known to monitor the output of a microwave oscillator via a directional coupler mounted outside the oscillator cavity. The directional coupler is designed so as to sample the waveguide output at the oscillator frequency and requires an appropriate mounting outside the oscillator cavity. Especially with oscillators in the mm-wave region of the spectrum, such couplers can be expensive to manufacture and to mount. Furthermore the directional coupler has a finite fixed insertion loss which may be considerably more than the sample power coupled out at small coupling values. For mm-wave couplers this fixed loss typically may be about 0.5 dB and so the available power from the source may be reduced by as much as 10%.

Such losses can be avoided by adopting a different approach to frequency stabilization, using a cavity resonator coupled to the source cavity. In an example of this known different form as proposed in published Japanese patent application kokai JP-A-55-83304, the cavity resonator also forms a detector section of the oscillator. Thus, the microwave oscillator of JP-A-55-83304 comprises a waveguide forming a source cavity separated from a detector section (the cavity resonator) by a reflective wall, and an oscillator device mounted in the source cavity for generating power of a desired microwave frequency; the wall is present at one end of the source cavity for reflecting the microwave power generated by the oscillator device; a first opening is present in another wall portion of the source cavity to provide a primary output of the microwave power; a coupling aperture is present in the reflective wall to provide as a secondary output a sample of the microwave power from the source cavity to the detector section; detector means is associated with the detector section for generating from the sample a signal indicative of whether the desired microwave frequency is being generated in the source cavity; a bias terminal to the source cavity serves for applying a bias signal for controlling the microwave power generated in the source cavity.

In this proposed oscillator of JP-A-55-83304, the detector means is a detection diode outside the cavity resonator but connected thereto by a coupling part projecting into the cavity resonator. The cavity resonator amplifies the extracted sample at the resonant frequency. A load resistance is connected to the detection diode, and the voltage developed across this load resistance is used to monitor deviation of the oscillator frequency from the resonant frequency of the cavity resonator. No voltage is developed across the resistance when the oscillator is generating an unwanted wavelength differing from resonance; when this condition is observed the bias signal to the oscillator is reduced to suppress the unwanted wavelength by stopping the oscillation.

Although the provision of such a detection arrangement with the cavity resonator indicates when the generated frequency deviates from the resonance, it does not indicate whether the deviation is to a higher or lower frequency, and the circuit arrangement of the detection diode and load resistance does not make provision for automatically regulating the bias signal to the oscillator so as to correct its frequency operation. Furthermore, such a cavity resonator can be expensive to manufacture.

SUMMARY OF THE INVENTION

It is an aim of the present invention to provide yet another different approach to frequency stabilization, which avoids the fixed losses arising from the use of a directional coupler, uses a coupling aperture (but without requiring a cavity resonator) to sample the signal generated in the source cavity, makes a simple but reliable provision for automatically regulating the oscillator to correct its frequency operation, and also permits the adoption of an inexpensive waveguide assembly of the source cavity and detector section.

The present invention permits this aim to be achieved with a microwave oscillator comprising a waveguide forming a source cavity separated from a detector section by a reflective wall, an oscillator device mounted in the source cavity for generating power of a desired microwave frequency, the wall being present at one end of the source cavity for reflecting the microwave power generated by the oscillator device, a first opening being present in another wall portion of the source cavity to provide a primary output of the microwave power, a coupling aperture being present in the reflective wall to provide as a secondary output a sample of the microwave power from the source cavity to the detector section, detector means associated with the detector section for generating from the sample a signal indicative of whether the desired microwave frequency is being generated in the source cavity, and a bias terminal to the source cavity for applying a bias signal for controlling the microwave power generated in the source cavity. Thus, according to the invention, for the purpose of achieving the desired aim such an oscillator is characterised in that the detector means is a mixer mounted in the detector section of the waveguide for mixing a stable reference with the sample from the coupling aperture and thereby generating a frequency signal which comprises any error in the oscillator frequency from the desired frequency, and a frequency discriminator is coupled in a feed-back loop between the mixer and the bias terminal for providing a corrective bias signal regulating the frequency of the oscillator in accordance with the frequency signal generated by the mixer.

Thus, the present invention provides a simple alternative means of deriving and using a sample output signal from a microwave source cavity in an advantageous feedback loop, for stabilizing the microwave frequency of the primary output of the oscillator. The frequency signal generated by the mixer represents both the magnitude and direction of deviation of the oscillator frequency and so the frequency operation of the oscillator is automatically regulated by a corrective bias signal from the feed-back loop. By sampling with a coupling aperture at a convenient wall portion of the waveguide, the fixed loss which occurs with a directional coupler outside the source cavity is avoided, and the magnitude of the primary output signal is merely reduced by the small amount of power actually coupled out at small coupling values. Furthermore, this is achieved without requiring a cavity resonator to amplify the low power level before it is detected. Thus, the applicants have found that when utilized with a mixer in a feed-back loop in accordance with the invention, only a very small amount of power (for example, typically less than 1 mW) needs to be extracted via the coupling aperture for the mixer, and that surprisingly this may be achieved satisfactorily by providing the coupling aperture in a reflective wall which is present at one end of the waveguide source cavity for reflecting the microwave power generated by the oscillator device. Such a location for the coupling aperture introduces very little disturbance of the source, such that its primary output power and other main characteristics remain virtually unchanged.

The primary output power extracted via the first opening may be, for example, in the range of 5 mW to 1 W. A simple Gunn oscillator may have an output power of for example the order of 10 mW, whereas that for a doppler radar may be of the order of 100 mW and that for a FMCW radar may be of the order of 1 Watt. Thus, for example, when between 0.1 mW and 1 mW of power is extracted as the secondary output, the inclusion of the coupling aperture may have an insignificant effect on the maximum power level obtainable from the source. The relative locations and sizes of the first opening and coupling aperture may be such that (depending on the particular system requirements) less than $-13$ dB, and preferably $-20$ dB or less, of the total output power of the source is extracted via the coupling aperture.

Because the coupling aperture is present in a reflective wall at one end of the source cavity, a convenient compact mechanical assembly can be readily achieved. The wall may be, for example, bolted to the end of the waveguide section. Such an end mounting of the reflective wall readily permits the inclusion of the wall between the source cavity and the further waveguide section of the mixer. An ordinary waveguide section may be used for the mixer. The first opening (primary output) and the coupling aperture (secondary output) may face in opposite directions from the waveguide source cavity, and waveguide sections forming the source cavity and the mixer section may be of substantially the same cross section. Thus, both the waveguide sections of the mixer and the source cavity may be formed as severed lengths of a single waveguide extrusion and may be bolted together in an assembly with the reflective wall sandwiched therebetween. Furthermore, such an end mounting feature may also be applied to the mounting of a mixer formed on a circuit substrate in the further waveguide section.

Thus, the applicants have found that, instead of mounting the mixer in a conventional manner in the further waveguide, adequate mixer performance for feed-back stabilization of the oscillator can be obtained with a mixer which comprises a circuit substrate mounted across the further waveguide and having on the substrate an inductive probe by which the secondary output of the source cavity is coupled to at least one mixer diode on the substrate. This further waveguide may in this case comprise two waveguide sections with the mixer circuit substrate sandwiched therebetween.

Thus, according to another aspect of the present invention, there is provided a novel mixer comprising a circuit substrate which is designed to be mounted between two waveguide sections so as to extend across the cavity of the waveguide sections. Such a circuit substrate may have a ground plane on a peripheral area of the substrate so as to extend adjacent to the walls of the waveguide sections, an inductive probe extending across a central area of the substrate which is free of the ground plane so as to couple to a signal field in the waveguide sections, and at least one mixer diode which is connected between the inductive probe and the ground plane.

The mixer may be formed advantageously as an harmonic mixer. Thus the mixer may comprise a pair of mixer diodes which are mounted on a circuit substrate and which are connected to a terminal of the circuit substrate by a low-pass filter and an inductive probe. The terminal may provide an output from the mixer and an input for a reference signal, while the low-pass filter serves to reflect harmonics of the reference signal back to the mixer diodes. Other advantageous features of such a mixer will be described later with reference to specific embodiments.

According to a further aspect of the present invention there is provided a microwave transmitter comprising a frequency-stabilized oscillator in accordance with the first aspect of the invention, and further characterised in that the primary output of the source cavity is coupled to an antenna of the transmitter, and in that the frequency-regulating bias terminal of the source cavity has one input from the feed-back loop and another input for a data signal representative of the information to be transmitted by the transmitter. A simple frequency-stabilised transmitter of this form is suitable for, for example, analogue video signals for local area transmission.

These and other features in accordance with the invention are illustrated specifically in embodiments of the invention now to be described, by way of example, with reference to the accompanying diagrammatic drawing figures. In these drawings figures.

DESCRIPTION OF THE PREFERRED EMBODIMENTS

Figure 1:
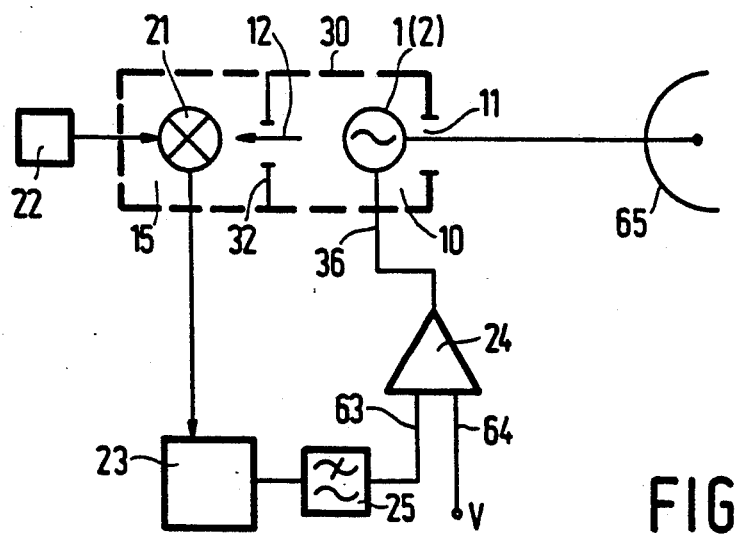
FIG. 1 is a schematic circuit block diagram of a microwave transmitter comprising a microwave oscillator which provides an output to an antenna and which has a feed-back control loop comprising an analogue data input.

It should be noted that all the drawings are diagrammatic and not drawn to scale. Relative dimensions and proportions of parts of the Figures have been shown exaggerated or reduced in size for the sake of clarity and convenience in the drawings. The same reference signs are generally used to refer to corresponding or similar features in the different embodiments.

The microwave oscillator in the transmitter of FIG. 1 comprises an oscillator device 1 (e.g. a negative-resistance oscillator diode) which generates microwave power of a desired frequency and which is mounted in a source cavity 10 of a waveguide 30. A first opening 11 at one conductive wall portion of the source cavity provides a primary output of the oscillator. This primary output is fed to a microwave antenna 65 of the transmitter. Preferably, as illustrated in FIGS. 2, 3, 6 and 10, a tuning diode 2 is also mounted in the source cavity 10 for electronically tuning the frequency of the oscillator. As will be described below, a feed-back loop (12,21,23,24,36) which comprises a mixer 21 in a further waveguide section 15 is used to monitor the oscillator frequency and to regulate the biasing of the tuning diode 2 via its terminal 36. The biasing of the tuning diode 2 is also controlled by a data signal which is representative of the information to be transmitted by the microwave transmitter and which is fed to an input 64 on the feed-back loop.

The oscillator diode 1 may be conveniently in the form of a Gunn diode, with a varactor as the tuning diode 2. The waveguide may be of any convenient geometry appropriate to the system in which the oscillator is incorporated. For that reason the waveguide 30 is illustrated simply by a broken outline block diagram in FIG. 1. By way of example, rectangular waveguide is illustrated in the specific drawings of FIGS. 2 to 8. The power level of the primary output through opening 11 may be, for example, of the order of 100 mW. The frequency of the primary output may be in the range of 26 GHz to 100 GHz, for example about 29 GHz for a personal communication network or about 42 GHz for a video distribution system.

The source cavity 10 is separated from the mixer section 15 of the waveguide 30 by a short-circuit wall 32 which is present at one end of the source cavity 10 for reflecting the microwave power generated by the oscillator device 1. A coupling aperture 12 is present in the short-circuit wall 32 to provide a sample of the microwave power from the source cavity 10 to the mixer section 15. This sample is a secondary output of the source cavity 10, is in phase coherence with the primary output and is used to monitor and stabilize the frequency performance of the oscillator via the feed-back loop (12,21,23,24,36). The present invention permits this stabilization to be achieved with only minimal power wastage, by using the coupling aperture 12 in the feedback loop (12,21,23, 24,36) with the mixer 21.

A local oscillator (LO) reference frequency related to the desired output frequency of the oscillator is fed to the mixer 21 in the waveguide section 15 from a stable source 22 outside the waveguide 30. In the specific embodiments of FIGS. 2 to 10, the mixer 21 is an harmonic mixer which multiplies the local oscillator frequency so that a lower frequency source 22 may be utilised having a harmonic close to the desired output frequency of the oscillator. Thus, an inexpensive stable source 22 may be used.

Figure 2:
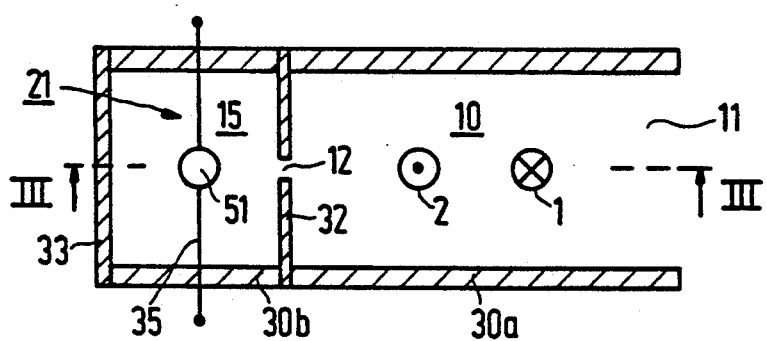
FIG. 2 is a schematic plan view of one example of a waveguide construction for the oscillator of FIG. 1.
Figure 3:
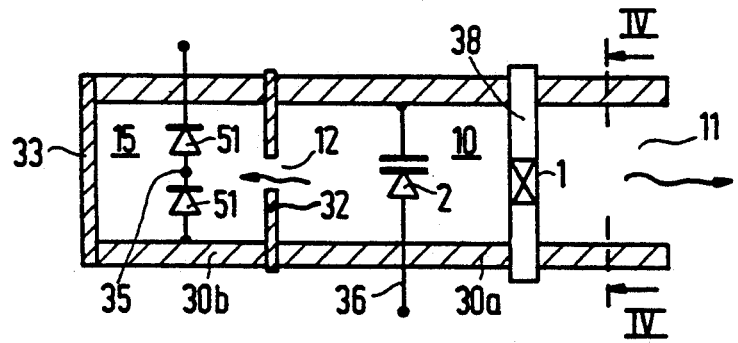
FIG. 3 is a cross-sectional side view of the waveguide construction of FIG. 2, and taken on the line III—III of FIG. 2.

FIGS. 2 and 3 illustrate one known construction of an harmonic mixer 21 comprising an anti-parallel pair of mixer diodes 51 mounted on posts vertically across a waveguide cavity 15. The mixer cavity 15 has a reflective back-short wall 33. One of the vertical mounting posts provides a bias terminal for the diodes 51, and a common connection from the pair of diodes 51 is formed by a horizontal cross-bar 35 passing through the side walls of the mixer cavity 15. The cross-bar connection 35 leads outside the waveguide 30 to a diplexing filter (not shown) via which the reference source 22 and frequency discriminator 23 are connected to the mixer 21. Instead of this post-mounting arrangement, the mixer components may be provided on an horizontal circuit substrate provided in the E-plane of the mixer cavity 15. A vertical substrate arrangement is also possible as described in a later embodiment.

The harmonic mixer 21 formed in the further cavity 15 requires only a very low power level from the second opening 12, for example about 0.3 mW. Thus with a Gunn diode generating 100 mW, about 99.7 mW is still available at the primary output 11. This is a considerable improvement over the use of a directional coupler with a 0.5 dB loss.

Because this mixer 21 requires only a very low level of secondary output power to regulate the tuning diode 2, it is easily compatible with the coupling aperture 12 being positioned at a location in the source cavity 10 having a field minimum or very low field intensity. The short-circuit wall 32 at one end of the source cavity 10 is such a low-field location which causes minimum disturbance to the oscillator performance, both its primary output power and its tuning characteristic. The coupling through the aperture 12 is via the electric field. The wall 32 is reflective of the microwave power generated by the Gunn diode 1 and so the electric field strength at the wall 32 is virtually zero. However the applicants find that the inclusion of an aperture 12 causes a slight leakiness in the reflective properties of the wall 32 so that a very low level of power leaks through the wall 32 at the aperture 12. It is found that between 0.1 mW and 1 mW of power can be extracted from the source cavity 10 of an oscillator generating a primary output power of about 100 mW, when the aperture 12 in the short-circuit wall 32 has a diameter of about 3 mm or less. Indeed with such an oscillator, the applicants find that it is not readily feasible to couple out such a low power level via an aperture provided at another wall location of the cavity 10 where the field is much higher than at the short-circuit wall 32, because the size of the opening required at this other field location would be so small as to be difficult to manufacture in the waveguide.

This location of the aperture 12 in the reflective end wall 32 is also convenient for mechanically mounting an harmonic mixer in accordance with the present invention. Thus, as in the specific examples illustrated in FIGS. 2 to 6, both the source cavity 10 and the mixer cavity 15 may be formed from severed lengths 30a, 30b (30c, 30d) of a single waveguide extrusion which may be bolted together end-to-end in a compact assembly with the short-circuit wall 32 sandwiched therebetween. Suitably-located bolt holes 34 through the waveguide sections 30a and 30b and the wall 32 are illustrated in FIG. 5. The cavities 10 and 15 are divided by the short-circuit wall 32 comprising the coupling aperture 12.

The feed-back loop from the source cavity 10 comprises the coupling aperture 12, the mixer 21, a frequency discriminator 23, an operational amplifier 24, and the bias terminal 36 to the source cavity 10. By heterodyning the sample output from aperture 12 with an harmonic of the LO reference from source 22, the harmonic mixer 21 generates and IF (intermediate frequency) signal. The frequency of this IF signal comprises as a component any frequency drift in the primary output 11 of the oscillator. This frequency signal (typically of the order of 100 MHz) is fed from the harmonic mixer along, for example, a coaxial cable to a frequency discriminator 23. A small low frequency amplifier may be included at the input to the frequency discriminator 23. The frequency discriminator 23 requires only a low power input from the mixer 21 and converts the input frequency in known manner into an output voltage. The frequency discriminator 23 may be constructed in known manner for example, as a Foster Seeley discriminator or a ratio detector or, for example, a phase lock loop or a pre-set programmable comparator which compares the frequency error signal with a reference from a stable source to generate the output voltage. This output voltage is then applied as a corrective signal via a low pass filter 25 to one input 63 of the operational amplifier 24. The data representative of the information to be transmitted by the antenna 65 is fed in a bias voltage signal V to the other input 64 of the amplifier 24, the output of which provides the corrected bias signal for the tuning diode 2 in the source cavity 10. This arrangement is particularly suitable for a stable but comparatively simple microwave transmitter of video signals, for example in a video distribution system for a local area. The analogue video data is simply added to the biasing of the tuner diode 2 by the amplifier 24. Furthermore, only frequency stabilisation is required for such an application, and not phase-locking, because a Gunn oscillator has good phase noise characteristics which are fully compatible with analogue video transmission. The feed-back loop has a very small bandwidth (typically about 1 Hz), and the source 22 provides a stable reference frequency without requiring reference phase noise characteristics. Thus, the source 22 can be comparatively simple and inexpensive, for example a dielectric resonator oscillator.

The Gunn diode 1 is spaced a quarter-wavelength or an odd number of quarter-wavelengths from the short-circuit wall 32. The precise location of the diodes 1 and 2 in relation to the wall 32 controls the tuning range achievable with the biasing of the tuning diode 2. The output 11 of the propagating waveguide 30 is at the opposite end from the wall 32, for example at a half-wavelength from the Gunn diode 1. Two variant examples of such a construction are illustrated in the embodiment of FIGS. 2 to 4 and that of FIG. 6.

Figure 4:
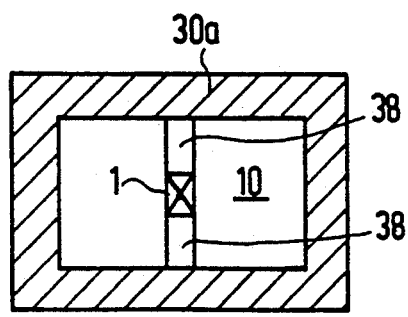
FIG. 4 is a view of the primary opening from the oscillator waveguide cavity of FIGS. 2 and 3, and taken on the line IV—IV of FIG. 3.
Figure 5:
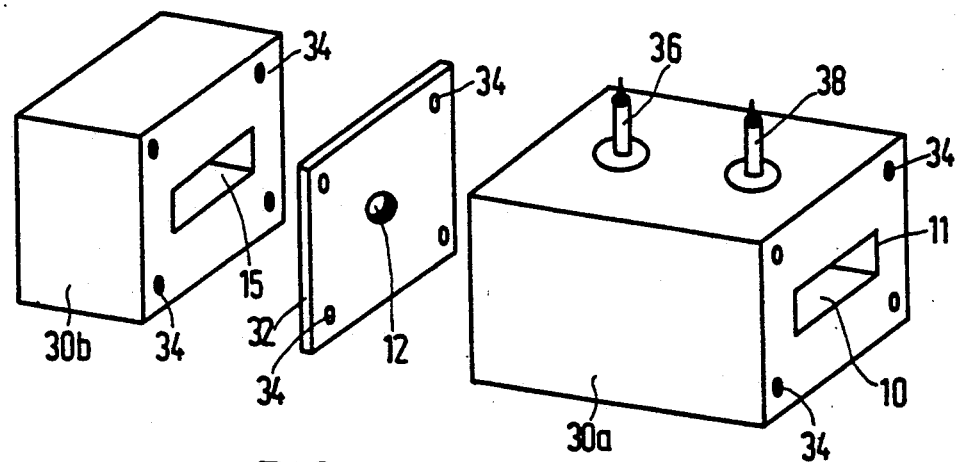
FIG. 5 is an exploded isometric view of the main waveguide component parts of the oscillator of FIGS. 2 and 3.

The oscillator of FIGS. 2 to 4 has a post-coupled primary output. In this form, the source cavity 10 comprises a length of propagating waveguide 30a open at one end 11 to provide the primary output, whereas the secondary output is the aperture 12 in the short-circuit wall 32 at the opposite end. The FIG. 4 view looking into the source cavity 10 from the first opening 11 shows the Gunn diode 1 between conductive mounting posts 38 in the waveguide 30.

Figure 6:
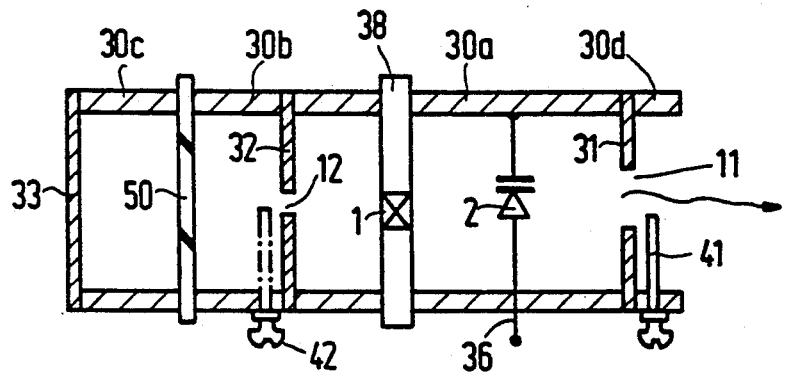
FIG. 6 is a cross-sectional side view of a modified form of the waveguide construction of FIGS. 2 and 3.

In the embodiment of FIG. 6, both the primary and secondary outputs are provided by respective apertures 11 and 12 in first and second conductive walls 31 and 32 mounted at opposite ends of the length of waveguide 30a. The wall 31 comprising the aperture 11 is mounted between facing ends of the waveguide sections 30a and 30d. The mixer cavity 15 is formed between a closed opposite end 33 of the waveguide sections 30b and 30c and the short-circuit wall 32 which comprises the second aperture 12. The aperture 11 is larger than the aperture 12.

By way of example, FIGS. 2, 3, 5 and 6 illustrate a circular opening for the aperture 12. An opening of circular shape can be formed easily in the wall 32 by, for example, drilling. However, other shapes may be used for the opening 12, for example a polygonal or a square or even a rectangular shape whose sides may, for example, be aligned parallel to the sides of the waveguide 30.

In the embodiment of FIG. 6, the aperture 11 providing the primary output may be of the same shape as the aperture 12, or it may be of different shape. Its size is chosen in accordance with the maximum power desired for the primary output, having regard to the field intensity at that location in the cavity 10.

In specific examples of the embodiments of FIGS. 2 to 6, the relative sizes (and shapes) of the openings 11 and 12 at their different field locations may be such that at most less than −13 dB (for example, about −20 dB) of the total output power of the oscillator is extracted via the second aperture 12. The secondary output may be at a level of about 0.1 to 0.5 mW, which (as described above) is still sufficient for controlling the tuning diode 2 using the advantageous harmonic mixer 21 in the feed-back loop 12, 21, 23, 24, 36. This low level of secondary output power has very little effect on the behaviour of the oscillator and its primary output via the opening 11, even in the case of an oscillator whose maximum output is only about 10 mW.

FIG. 6 also illustrates the provision of metal tuning screws 41 and 42 outside the cavity 10 but in the vicinity of the respective apertures 11 and 12 so as to tune the output power which is coupled out of the cavity 10 by that aperture 11 or 12. This permits a further degree of control of the output power after the oscillator has been assembled and even during its operational use. The screw 41 or 42 can be wound out to a sufficient extent that it does not affect the output power through the respective aperture 11 or 12. As the screw 41 or 42 is wound in from this position, the power output first increases to a peak and then decreases as the screw obstructs more of the respective aperture 11 or 12. Preferably the screws 41 and 42 are mounted as close as possible to the respective aperture 11 or 12, outside the source cavity 10. As illustrated by its broken outline in FIG. 6, tuning screw 42 may be omitted if it is not desired (or appropriate) to tune the second output in this manner. The screw 41 may also be omitted.

In the two embodiments of FIGS. 2 to 5 and FIG. 6, the varactor 2 may be positioned anywhere in the oscillator cavity 10 where the strength of the field is suitable for the degree of coupling needed for the desired tuning range of the oscillator.

As shown in FIGS. 2 to 6 the microwave components of the harmonic mixer 21 are mounted in the further waveguide cavity 15 immediately behind the back-short 32 of the source cavity 10. The mixer diode (or diodes) 51 may be mounted on waveguide posts in the cavity 15, as illustrated in FIGS. 2 and 3. However FIGS. 6 to 9 illustrate a more advantageous arrangement in which the mixer 21 comprises components on a microstrip substrate 50 mounted across the further cavity 15.

These components comprise an inductive probe 52, an anti-parallel pair of mixer diodes 51, low-pass filters 53 and 54, and a by-pass capacitor 55. There is a ground plane 56 and 57. This mixer circuit substrate 50 is designed to be mounted between the two waveguide sections 30b and 30c so as to extend across the cavity of the sections 30b and 30c. It can be secured by bolting through the holes 34. This mixer arrangement may also be adopted in a modification of the oscillator of FIGS. 2 to 5.

Figure 7:
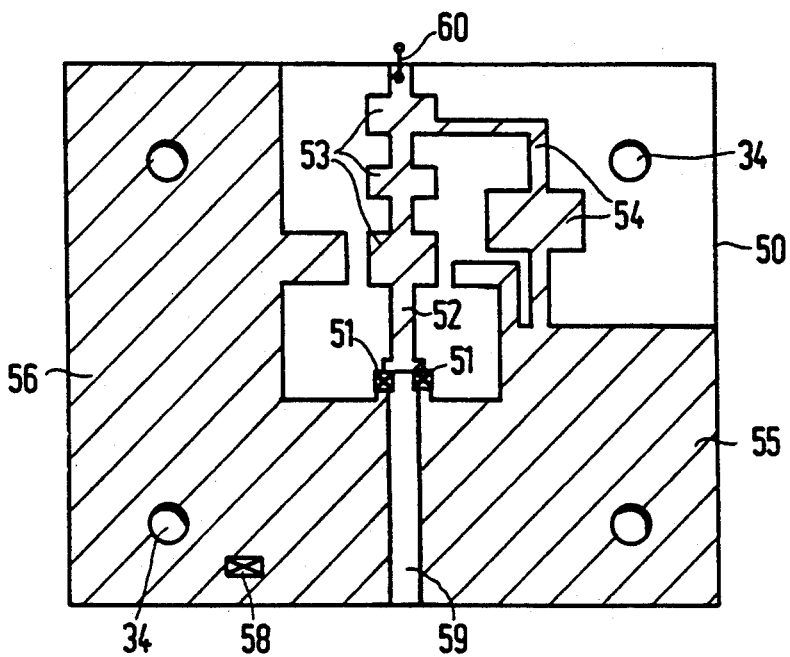
FIG. 7 is a plan view of the front surface of a circuit substrate comprising a mixer in accordance with the present invention and suitable for mounting in the oscillators of FIGS. 1 and 6.
Figure 8:
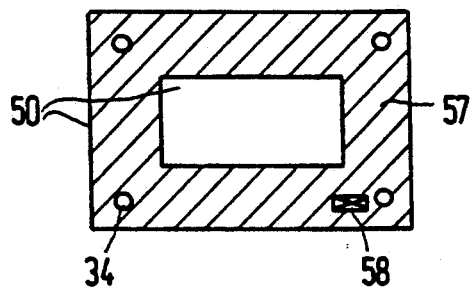
FIG. 8 is a plan view of the back surface of the circuit substrate of FIG. 7.
Figure 9:
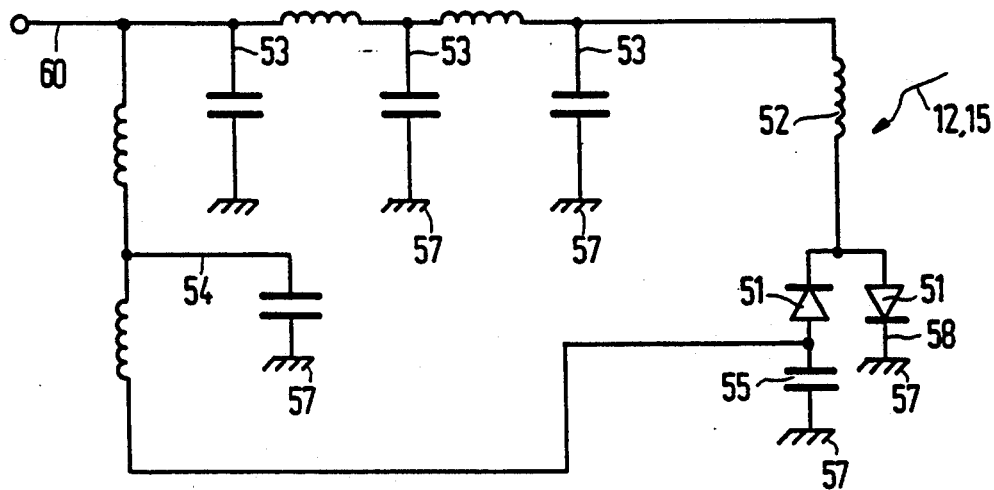
FIG. 9 is a circuit diagram of the mixer of FIGS. 7 and 8.

The substrate 50 is of a suitable dielectric material, for example that commercially available under the Trade Name RT duroid. Areas of metallization on the substrate 50 are shown hatched in FIGS. 7 and 8. The back surface of the substrate 50 (as shown in FIG. 8) is metallized with a ground plane 57 around its peripheral area which extends adjacent to the walls of the waveguide sections 30b and 30c. The metallization at the front surface of the substrate 50 (as shown in FIG. 7) comprises an extension 56 of the ground plane which is directly connected to back plane 57 by a metallized via 58. A further metallization area 55 at the front surface forms with the back plane 57 an RF by-pass capacitor to earth at the frequencies of the signals from the coupling aperture 12, the local oscillator source 22 and its harmonic and the IF output of the mixer. A central area of the substrate 50 which lies in the cavity area of the waveguide sections 30b and 30c is free of the ground plane and capacitor metallization 55,56 and 57.

An inductive probe formed by a strip 52 of the metallization extends across this otherwise free central area of the substrate 50 so as to couple to the sample field in the cavity 15 from the aperture 12. One mixer diode 51 is connected across a gap between the ground plane metallization 56 and one end of the probe 52. The other mixer diode 51 is connected across a gap between the capacitor metallization 55 and the same end of the probe 52. A gap 59 between the metallization areas 55 and 56 permits biasing of these antiparallel diodes 51. Inductive and capacitive elements formed by metallization 54 (with ground plane 57) form a low-pass filter providing d.c. bias to the diodes 51 from an input terminal 60. The terminal 60 also provides an IF output from the mixer and an input for the reference signal from the local oscillator 22 and, for this reason, leads to a diplexing filter outside the waveguide 30 for the IF and LO signals. Thus, the substrate 50 has a single input/output connection 60.

The anti-parallel pair of mixer diodes 51 are connected to the terminal 60 by the inductive probe 52 and a low-pass filter 53. This low-pass filter comprises inductive and capacitive elements formed by metallization 53 (with ground plane 57) and provides a short-circuit to frequencies above the fundamental frequency of the local oscillator 22. The harmonics of the local oscillator frequency which are generated in the mixer are thus reflected by the filter 53 back to the mixer diodes 51.

In order to prevent short-circuiting of the metallization areas 53 to 55 to the facing wall of the waveguide section 30b or 30c, at least this peripheral area of the front face of the substrate 50 is covered with an insulating film or layer. Such an insulating film or layer may have the hatched shape of the back metallization shown in FIG. 8 so as not to overlay the cavity area of the substrate 50 and its probe 52. However, the whole of the front face of the substrate 50 including the area of its probe 52 may be overlaid with the insulating film or layer.

Figure 10:
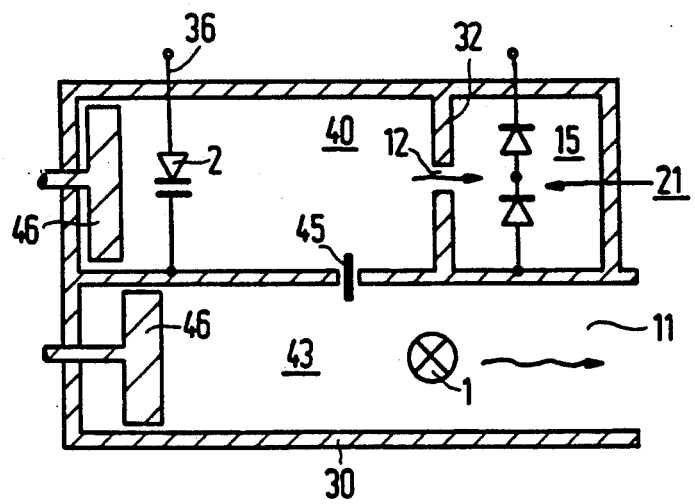
FIG. 10 is a cross-sectional side view of one example of a second-harmonic waveguide oscillator in accordance with the invention.

Other and more sophisticated forms of oscillator may be designed in accordance with the invention. Thus, for example, FIG. 10 illustrates an oscillator whose primary output at opening 11 is taken at the second harmonic of the natural frequency of the Gunn diode 1. This second-harmonic oscillator is of the same basic type as that described in the paper by R. N. Bates and S. Feeney in Electronics Letters (Jul. 2, 1987) Vol. 23 No. 14 pages 714 and 715 and in published European patent application EP-A-0 114 437 (our reference PHB32947), the whole contents of which are hereby incorporated herein as reference material. In this case, the source cavity 10 comprises a primary cavity 43 and a second cavity 44 which are coupled together, for example by a probe 45 through a common dividing wall. The primary cavity 43 provides the primary output at opening 11 and comprises the oscillator diode 1 coupled thereto at its second harmonic. A sliding short-circuit 46 is also shown in the cavity 43. The secondary cavity 44 comprises the tuning diode 2 and is resonant at the fundamental frequency of the oscillator diode 1. A sliding short-circuit 46 is also included in the resonant cavity 44.

In accordance with the present invention, the oscillator of FIG. 10 is modified (compared with the basic type of EP-A-0 114 437 and the Electronics Letters paper) by the provision of a feed-back loop 12,21,23,24,36 (as illustrated in FIG. 1) from a secondary microwave output in the form of an aperture 12 which may be provided in any of the outside end walls of the cavities 43 and 44. When such a secondary output is taken from the primary cavity 43, it will be at the second harmonic. However, preferably the secondary output is taken from the secondary cavity 44, as illustrated in FIG. 10, in which the aperture 12 is present in a reflective short-circuit wall at one end of the cavity 44. In this case the secondary cavity 44 provides the secondary output at the fundamental frequency, i.e. half the frequency of the primary output, but still in phase coherence with the primary output. This secondary output signal is fed to the mixer 21 in a further waveguide cavity 15, where it is mixed with a reference frequency (from a source 22) related to the second harmonic so as to provide a corrective control signal for biasing the varactor 2, i.e. in a manner similar to that of FIG. 1.

In the specific examples illustrated so far, the oscillators comprise a Gunn diode as the source device 1. However, other types of negative-resistance oscillator diode may be used instead, for example an IMPATT diode. A field-effect transistor may alternatively be used, connected in known manner in a feed-back tuning network to function as an oscillator device.

Instead of providing a varactor or other tuning device 2 in the source cavity 10, the corrected bias voltage from the amplifier 24 may be fed to a bias terminal 36 of the oscillator device 1. In this case the output frequency of the oscillator is directly tuned by regulating the bias on the oscillator device 1, but this change of the bias voltage also affects the level of output power from the oscillator device 1. By contrast, the use of the tuning diode 2 permits frequency tuning without changing the output power level, requires less input power for the tuning and provides a broader linear tuning range. Thus, the FIG. 1 arrangement with a regulated tuning device 2 provides a finer tuning of the oscillator frequency, and so is preferred where high performance is required.

Instead of using an harmonic mixer 21, an harmonic multiplier may be included in the connection between the reference source 22 and a non-harmonic mixer 21 in the waveguide cavity 15. The fundamental of the LO signal from the source 22 may be multiplied in this way (for example by 10 times) before being fed to the mixer 21 for mixing with the sample from the coupling aperture 12.

From reading the present disclosure, other variations and modifications will be apparent to persons skilled in the art. Such variations and modifications may involve equivalents and other features which are already known in the design, manufacture and use of microwave sources, mixers and waveguide assemblies and component parts thereof, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A microwave oscillator comprising a waveguide forming a source cavity separated from a detector section by a reflective wall, an oscillator device mounted in the source cavity for generating power of a desired microwave frequency, the wall being present at one end of the source cavity for reflecting the microwave power generated by the oscillator device, a first opening being present in another wall portion of the source cavity to provide a primary output of the microwave power, a coupling aperture being present in the reflective wall to provide as a secondary output a sample of the microwave power from the source cavity to the detector section, detector means associated with the detector section for generating from the sample a signal indicative of whether the desired microwave frequency is being generated in the source cavity, and a bias terminal to the source cavity for applying a bias signal for controlling the microwave power generated in the source cavity, which oscillator is characterised in that the detector means is a mixer mounted in the detector section of the waveguide for mixing a stable reference with the sample from the coupling aperture and thereby generating a frequency signal which comprises any error in the oscillator frequency from the desired frequency, and a frequency discriminator is coupled in a feed-back loop between the mixer and the bias terminal for providing a corrective bias signal regulating the frequency of the oscillator in accordance with the frequency signal generated by the mixer.

2. An oscillator as claimed in claim 1, further characterised in that the mixer comprises a circuit substrate with an inductive probe by which the sample from the aperture is coupled to at least one mixer diode on the circuit substrate, and in that the detector section of the waveguide comprises two waveguide sections between which the mixer substrate is mounted across the detector section.

3. An oscillator as claimed in claim 2, further characterised in that the circuit substrate has a ground plane on a peripheral area of the substrate so as to extend adjacent to the walls of the waveguide sections, the inductive probe extends across a central area of the substrate which is free of the ground plane so as to couple to the sample field in the detector section, and the at least one mixer diode is connected between the inductive probe and the ground plane.

4. An oscillator as claimed in claim 3, further characterised in that the mixer is an harmonic mixer and comprises a pair of mixer diodes which are connected to a terminal of the circuit substrate by a low-pass filter and the inductive probe, the terminal provides an output from the mixer and an input for the reference signal, and the low-pass filter reflects harmonics of the reference signal back to the mixer diodes.

5. An oscillator as claimed in claim 1, 2, 3 or 4, further characterised in that the first opening and the coupling aperture face in opposite directions from the waveguide source cavity, and in that waveguide sections forming the source cavity and detector section are of substantially the same cross section.

6. An oscillator as claimed in claim 5, further characterised in that the source cavity comprises a length of waveguide which has the reflective wall across one end and which is open at the opposite end to provide the primary output.

7. An oscillator as claimed in claim 5, further characterised in that the source cavity comprises a length of waveguide which has the reflective wall across one end and a further wall spaced therefrom towards an opposite end, in which further wall a further aperture is present to provide the primary output, said further aperture being larger than the aperture which provides the secondary output.

8. An oscillator as claimed in claim 1, 2, 3 or 4, further characterised in that the waveguide source cavity comprises primary and secondary cavities which are coupled together and which provide the primary and secondary outputs respectively, the primary cavity comprises the oscillator device coupled thereto at its second harmonic, and the secondary cavity is resonant at the fundamental frequency of the oscillator device and comprises a tuning device for electronically tuning the frequency of the microwave power output of the source, the coupling aperture being present in a reflective wall between the secondary cavity and the detector section to provide the sample at the fundamental frequency of the oscillator device while the first opening of the primary cavity provides the primary output power at the second harmonic.

9. An oscillator as claimed in claim 1, 2, 3 or 4, further characterised in that a tuning device is mounted in the source cavity for electronically tuning the frequency of the microwave power generated by the oscillator, and the bias terminal of the source cavity is a bias terminal of the tuning device.

10. An oscillator as claimed in claim 1, 2, 3 or 4, further characterised in that the relative locations and sizes of the first opening and coupling aperture are such that the power extracted via the coupling aperture is less than −13 dB of the total output power of the source and is less than 1 mW.

11. A microwave transmitter comprising an oscillator as claimed in claim 1, 2, 3 or 4, further characterised in that the primary output of the source cavity is fed to an antenna, and in that the frequency-regulating bias terminal of the source cavity has one input from the feedback loop and another input for a data signal representative of the information to be transmitted by the transmitter.

* * * * *